US012575404B2

(12) United States Patent
    Wu

(10) Patent No.: US 12,575,404 B2
(45) Date of Patent: Mar. 10, 2026

(54) SEMICONDUCTOR DEVICE WITH PROTECTION LAYER AND METHOD FOR FABRICATING THE SAME

(71) Applicant: NANYA TECHNOLOGY CORPORATION, New Taipei City (TW)

(72) Inventor: Chun-Heng Wu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 362 days.

(21) Appl. No.: 18/230,183

(22) Filed: Aug. 4, 2023

(65) Prior Publication Data

US 2025/0046708 A1     Feb. 6, 2025

(51) Int. Cl.
    *H01L 23/528*        (2006.01)
    *H01L 21/768*        (2006.01)
(52) U.S. Cl.
    CPC .... *H01L 23/5283* (2013.01); *H01L 21/76877* (2013.01)
(58) Field of Classification Search
    CPC .......... H01L 23/5283; H01L 21/76877; H01L 21/0334; H01L 21/0206; H01L 21/0332; H01L 21/0337
    See application file for complete search history.

(56) References Cited

U.S. PATENT DOCUMENTS

| | | | |
|---|---|---|---|
| 2005/0016948 A1 | 1/2005 | Yang et al. | |
| 2006/0267131 A1* | 11/2006 | Smythe ............. | H01L 21/76224 |
| | | | 257/E21.546 |
| 2008/0166888 A1 | 7/2008 | Hsu et al. | |
| 2018/0247996 A1 | 8/2018 | Wang et al. | |
| 2023/0230872 A1 | 7/2023 | Chen | |

FOREIGN PATENT DOCUMENTS

| | | |
|---|---|---|
| CN | 101366112 A | 2/2009 |
| CN | 112736022 A | 4/2021 |
| CN | 114420631 A | 4/2022 |
| TW | 396520 B | 7/2000 |

OTHER PUBLICATIONS

Office Action and the search report mailed on Oct. 11, 2024 related to Taiwanese Application No. 113112711.
Office Action and the search report mailed on Jun. 14, 2024 related to Taiwanese Application No. 112134358.

* cited by examiner

*Primary Examiner* — Thanh T Nguyen
(74) *Attorney, Agent, or Firm* — Xuan Zhang

(57) ABSTRACT

The present application discloses a semiconductor device and a method for fabricating the semiconductor device. The semiconductor device includes a substrate; a first outer filling layer including a first concave portion inwardly positioned in the substrate and including a U-shaped cross-sectional profile, and a first flat portion positioned on the substrate and connecting to the first concave portion; a first center layer positioned on the first concave portion of the first outer filling layer; and a first protection layer positioned on the first center layer. A top surface of the first concave portion and a top surface of the first protection layer are substantially coplanar.

17 Claims, 17 Drawing Sheets

<u>10</u>

Providing a substrate including a first region and a second region, forming a plurality of first trenches in the first region, and forming a second trench in the second region ⟋S11

Forming a plurality of first outer filling layers in the plurality of first trenches, forming a plurality of first center layers on the plurality of first outer filling layers and within the plurality of first trenches, forming a second outer filing layer in the second trench, conformally forming a second center layer on the second outer filing layer, and forming a second inner filling layer on the second center layer and within the second trench ⟋S13

Forming a plurality of first protection layers on the plurality of first center layers and forming a second protection layer on the second center layer ⟋S15

Performing an implantation process over the substrate and forming a word line hard mask layer over the substrate ⟋S17

FIG. 1

SEMICONDUCTOR DEVICE WITH PROTECTION LAYER AND METHOD FOR FABRICATING THE SAME

TECHNICAL FIELD

The present disclosure relates to a semiconductor device and a method for fabricating the semiconductor device, and more particularly, to a semiconductor device with a protection and a method for fabricating the semiconductor device with the protection layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a first outer filling layer including a first concave portion inwardly positioned in the substrate and including a U-shaped cross-sectional profile, and a first flat portion positioned on the substrate and connecting to the first concave portion; a first center layer positioned on the first concave portion of the first outer filling layer; and a first protection layer positioned on the first center layer. A top surface of the first concave portion and a top surface of the first protection layer are substantially coplanar.

Another aspect of the present disclosure provides a semiconductor device including a substrate including a first region and a second region; a second outer filing layer including a second concave portion inwardly positioned in the second region of the substrate and including a U-shaped cross-sectional profile, and a second flat portion positioned on the substrate and connecting to the second concave portion; a second center layer conformally positioned on the second concave portion and including a U-shaped cross-sectional profile; an inner filling layer positioned on the second center layer; and a plurality of second protection layers positioned on two ends of the second center layer and positioned between the second concave portion and the inner filling layer. A top surface of the second concave portion, a top surface of the inner filling layer, and a top surface of the plurality of second protection layers are substantially coplanar.

Another aspect of the present disclosure provides a method for fabricating a semiconductor device including providing a substrate; forming a first trench in the substrate;

conformally forming a layer of first filling material on the substrate and within the first trench, resulting in forming a first recess within the first trench; forming a layer of second filling material on the layer of first filling material, completely filling the first recess; performing a planarization process until the layer of first filling material is exposed to turn the layer of first filling material into a first outer filling layer and turn the layer of second filling material into a first center layer; and performing a surface oxidation process to form a first protection layer on the first center layer.

Due to the design of the semiconductor device in the present disclosure, the surface (i.e., the top surfaces of the first outer filling layer, the second outer filling layer, the first protection layer, and the second protection layer) remains intact and substantially flat for subsequent semiconductor processes. As a result, the reliability of the semiconductor device is improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 illustrates, in a flowchart diagram form, a method for fabricating a semiconductor device in accordance with one embodiment of the present disclosure.

DETAILED DESCRIPTION

Figure 2:
FIGS. 2 to 17 illustrate, in schematic cross-sectional view diagrams, a flow for fabricating the semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1 in accordance with one embodiment of the present disclosure. FIGS. 2 to 17 illustrate, in schematic cross-sectional view diagrams, a flow for fabricating the semiconductor device 1 in accordance with one embodiment of the present disclosure.

With reference to FIGS. 1 to 6, at step S11, a substrate 101 including a first region R1 and a second region R2 may be provided, a plurality of first trenches TR1 may be formed in the first region R1, and a second trench TR2 may be formed in the second region R2.

With reference to FIG. 2, the substrate 101 may include a bulk semiconductor substrate. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, in some embodiments, the first region R1 and the second region R2 may be adjacent to each other. In some embodiments, the first region R1 and the second region R2 may be separated from each other. It should be noted that the first region R1 may comprise a portion of the substrate 101 and a space above the portion of the substrate 101. Describing an element as being disposed on the first region R1 means that the element is disposed on a top surface of the portion of the substrate 101. Describing an element as being disposed in the first region R1 means that the element is disposed in the portion of the substrate 101; however, a top surface of the element may be even with the top surface of the portion of the substrate 101. Describing an element as being disposed above the first region R1 means that the element is disposed above the top surface of the portion of the substrate 101. Accordingly, the second region R2 may comprise another portion of the substrate 101 and a space above the other portion of the substrate 101. In some embodiments, the first region R1 and the second region R2 may have different element density which will be illustrated later.

Figure 3:
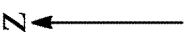

With reference to FIG. 3, a bottom hard mask layer 701 may be formed on the substrate 101. In the bottom hard mask layer 701 may be formed of, for example, silicon oxide. In some embodiments, the bottom hard mask layer 701 may be formed by performing a rapid thermal oxidation to the intermediate semiconductor device illustrated in FIG. 2 in an oxide/oxynitride atmosphere. In some embodiments, the temperature of the rapid thermal oxidation may be about 1000° C.

With reference to FIG. 3, a top hard mask layer 703 may be formed on the bottom hard mask layer 701. In some embodiments, the top hard mask layer 703 may be formed of, for example, silicon oxide. In some embodiments, the top hard mask layer 703 may be formed by, for example, chemical vapor deposition, plasma enhanced chemical vapor deposition. For example, the top hard mask layer 703 may be deposited by chemical vapor deposition using a silicate or silicon source, a number of doping sources, and an ozone source. In some embodiments, the doping sources may be optional. In some embodiments, the doping sources may be, for example, triethylborate, triethylphosphate, triethyphosphite, trimethylphosphate, or trimethylphosphite. In some embodiments, the silicate or silicon source may be, for example, tetramethylorthosilicate. The doping sources may result in impurity atoms such as phosphorus or boron in the top hard mask layer 703.

With reference to FIG. 3, a first mask layer 901 may be formed on the top hard mask layer 703. In some embodiments, the first mask layer 901 may be a photoresist layer and may include a pattern of the plurality of first trenches TR1 and the second trench TR2.

Figure 4:

With reference to FIG. 4, a hard mask etching process may be performed using the first mask layer 901 as the mask to remove a portion of the top hard mask layer 703 and a portion of the bottom hard mask layer 701. After the hard mask etching process, the pattern of the first mask layer 901 may be transferred to the top hard mask layer 703 and the bottom hard mask layer 701. The pattern transferred from the first mask layer 901 may be referred to as a first pattern P1 and a second pattern P2. The first pattern P1 may be formed above the first region R1. The second pattern P2 may be formed above the second region R2. Portions of the top surface 101T of the substrate 101 may be exposed through the first pattern P1 and the second pattern P2.

In some embodiments, the etch rate of the top hard mask layer 703 (or the bottom hard mask layer 701) of the hard mask etching process may be faster than the etch rate of the substrate 101 of the hard mask etching process. For example, the etch rate ratio of the top hard mask layer 703 (or the bottom hard mask layer 701) to the substrate 101 may be between about 100:1 and about 2:1 during the hard mask etching process. For another example, the etch rate ratio of the top hard mask layer 703 (or the bottom hard mask layer 701) to the substrate 101 may be between about 100:1 and about 10:1 during the hard mask etching process.

With reference to FIG. 4, the first mask layer 901 may be removed after the formation of the first pattern P1 and the second pattern P2. In some embodiments, the removal of the first mask layer 901 may be, for example, an ashing process or other applicable semiconductor processes.

Figure 5:

With reference to FIG. 5, a trench etching process may be performed, utilizing the bottom hard mask layer 701 and the top hard mask layer 703 as masks, to remove a portion of the substrate 101. This process results in the formation of the plurality of first trenches TR1 in the substrate 101 and the second trench TR2 in the second region R2.

In some embodiments, the etch rate of the substrate 101 of the trench etching process may be faster than the etch rate of the top hard mask layer 703 (or the bottom hard mask layer 701) of the trench etching process. For example, the etch rate ratio of the substrate 101 to the top hard mask layer 703 (or the bottom hard mask layer 701) may be between about 100:1 and about 2:1 during the trench etching process. For another example, the etch rate ratio of the substrate 101 to the top hard mask layer 703 (or the bottom hard mask layer 701) may be between about 100:1 and about 10:1 during the trench etching process.

In some embodiments, the first region R1 may have a higher element density (or pattern density or feature density) compared to that of the second region R2. The element density is a value determined by dividing the number of elements (e.g., first trenches TR1 or second trench TR2) formed in the first region R1 (or the second region R2) by the surface area of the respective region from a top-view perspective. From a cross-sectional perspective, a region with higher element density contains more elements, and the distance between adjacent elements (or features) is smaller compared to a region with lower element density. As shown in FIG. 5, the presence of more first trenches TR1 is used to emphasize that the first region R1 has a higher element density than the second region R2. It should be noted that the numbers of first trenches TR1 or second trench TR2 shown in FIG. 5 are for illustrative purposes only.

In some embodiments, a post-etching cleaning process may be performed after the formation of the plurality of first trenches TR1 and the second trench TR2. The post-etching cleaning process may include three stages with inter-stage rinses between stages. Detailedly, during the first stage of the post-etching cleaning process, a first cleaning solution may be applied to the intermediate semiconductor device after the formation of the plurality of first trenches TR1 and the second trench TR2. The first cleaning solution may be rinsed by the first inter-stage rinse. During the second stage of the post-etching cleaning process, a second cleaning solution may be applied to the intermediate semiconductor device and the second cleaning solution may be subsequently rinsed by a second inter-stage rinse. During the third stage of the cleaning process, a third cleaning solution may be applied to the intermediate semiconductor device and then be rinsed by a post-stage rinse.

In some embodiments, during the first stage of the post-etching cleaning process, the intermediate semiconductor device may be spun at a rate between about 10 rpm and about 2000 rpm or between about 100 rpm and 1000 rpm. The first cleaning solution may be sprayed onto the intermediate semiconductor device to cover the entire front side of the intermediate semiconductor device. Simultaneously to applying the first cleaning solution onto the front side of the intermediate semiconductor device, water or other suitable solution may be applied to the backside of the intermediate semiconductor device to clean the backside of the intermediate semiconductor device.

In some embodiments, the first cleaning solution may include diluted hydrofluoric acid. The concentration of the first cleaning solution may be between about 5 parts deionized water to one part hydrofluoric acid and about 1000 parts deionized water to one part hydrofluoric acid, about 300 parts deionized water to one part hydrofluoric acid, or about 50 parts deionized water to one part hydrofluoric acid. Generally, the front side of the intermediate semiconductor device may be exposed to the first cleaning solution for a time sufficient to etch either a sacrificial oxide (typically around 50 angstroms to 200 angstroms) or a native oxide (typically around 10 angstroms.) In some embodiments, the process time of the first stage of the cleaning process may be between about 20 seconds and about 50 seconds, about 40 seconds, or about 30 seconds. In some embodiments, the process time of the first stage of the post-etching cleaning process may be between about 1 minutes and about 5 minutes.

In some embodiments, the first cleaning solution may further include fluoride compound(s), organic acid salt(s), and/or glyoxylic acid.

The fluorine compound(s) may be contained in the first cleaning solution as a component for removing the etching residue of the trench etching process. Examples of the fluorine compound(s) may include hydrofluoric acid and ammonium or amine fluoride salts such as, for example, ammonium fluoride, ammonium hydrogen fluoride, methylamine hydrofluoride, ethylamine hydrofluoride, propylamine hydrofluoride, tetramethylammonium fluoride, tetraethylammonium fluoride, ethanolamine hydrofluoride, methylethanolamine hydrofluoride, dimethylethanolamine hydrofluoride, and triethylenediamine hydrofluoride. In some embodiments, the concentration of the fluorine compound(s) in the first cleaning solution may be determined according to the composition of the etching residue. For example, the concentration of the fluorine compound(s) may be between about 0.1 mass % and about 5 mass % of the entire composition of the first cleaning solution, or between about 0.2 mass % and about 3 mass % of the entire composition of the first cleaning solution.

The organic acid salt(s) may include, for example, ammonium oxalate, ammonium tartrate, ammonium citrate, and ammonium acetate. The organic acid salt(s) may act as a pH adjusting agent(s) or buffer agent(s) in the first cleaning solution. The concentration of the organic acid salt(s) may be between about 0.1 mass % and about 10 mass % of the entire composition of the first cleaning solution, or between about 0.3 mass % and about 5 mass % of the entire composition of the first cleaning solution.

The glyoxylic contained in the first cleaning solution may serve as a corrosion inhibitor.

In some embodiments, the first cleaning solution may further include a resist removal component. Examples of the resist removal component include tetramethylammonium hydroxide and/or monomethanolamine.

The first inter-stage rinse may be performed after the first stage of the post-etching cleaning process. During the first inter-stage rinse, the intermediate semiconductor device after the first stage of the post-etching cleaning process may be rotated at between about 10 rpm and about 1000 rpm while being rinsed with deionized water. In some embodiments, the rinse temperature may be between about 19° C. and about 23° C. In some embodiments, the process time of the first inter-stage rinse may be between about 20 seconds and about 50 seconds, or about 30 seconds.

In some embodiments, the deionized water used for the first inter-stage rinse may be oxygenated or ozonated by dissolving oxygen gas or ozone gas before rinsing the intermediate semiconductor device. Dissolved oxygen or ozone may be added to the deionized water in a concentration of greater than 1 ppm to serve as an oxidant. For example, the concentration of dissolved oxygen or ozone may be between about 1 ppm and about 200 ppm or between about 2 ppm and about 20 ppm. For another example, the deionized water may be saturated with dissolved oxygen or ozone. Alternatively, hydrogen peroxide may be added to the deionized water in a concentration of greater than 100 ppm to serve as an oxidant. Whichever oxidant is used, it should have an oxidation potential sufficient to oxidize the most noble metal in the solution. Copper ($Cu^{2+}$), with a standard reduction potential of 0.3V, is usually the most noble metal present. Therefore, a standard reduction potential of greater than 0.5V is desired. Oxygen or ozone will solvate the metal ions and prevent precipitation by oxidizing the metal ions that are in solution. This will help decrease the processing time by making the first inter-stage rinse more effective.

In some embodiments, the deionized water used for the first inter-stage rinse may carbon dioxide dissolved into it to dissipate static electricity that builds up in the deionized water. Static electricity builds up in the deionized water may originate from the rotation of the intermediate semiconductor device. The dissolved carbon dioxide may also make the deionized water more acidic and therefore reduces any metallic contamination. In some embodiments, carbon dioxide may be dissolved into the deionized water in an amount sufficient to dissipate static electricity. For example, the amount of carbon dioxide dissolved into the deionized water may be sufficient to decrease the resistivity of the deionized water to less than 5 Megaohm·cm.

In some embodiments, the deionized water used for the first inter-stage rinse may have isopropyl alcohol, or any other liquid with a surface tension lower than that of the deionized water, added to it. Isopropyl alcohol may aid by making the deionized water spread out over the front side of the intermediate semiconductor device so that the chemicals are removed more quickly. Isopropyl alcohol may also help the rinse spin off of the intermediate semiconductor device during spinning. Alternatively, isopropyl alcohol vapor may be blown onto the front side of the intermediate semiconductor device while rinsing to assist the first inter-stage rinse.

In some embodiments, during the second stage of the post-etching cleaning process, the intermediate semiconductor device after the first inter-stage rinse may be spun at a rate between about 10 rpm and about 2000 rpm or between about 100 rpm and 1000 rpm. The second cleaning solution may be sprayed onto the intermediate semiconductor device to cover the entire front side of the intermediate semiconductor device. Simultaneously to applying the second cleaning solution onto the front side of the intermediate semiconductor device, water or other suitable solution may be applied to the backside of the intermediate semiconductor device to clean the backside of the intermediate semiconductor device.

In some embodiments, the second cleaning solution may be an alkaline solution including, for example, aqueous solutions of inorganic compounds such as sodium hydroxide, potassium hydroxide and ammonium hydroxide, and aqueous solution of organic compounds such as tetramethylammonium hydroxide and choline. The second cleaning solution may also include hydrogen peroxide. The purpose of the ammonium hydroxide and the hydrogen peroxide in the second cleaning solution is to remove particles and residual organic contaminants from the front side of the intermediate semiconductor device.

For example, in the present embodiment, the second cleaning solution may include ammonium hydroxide, hydrogen peroxide, and water. The ammonium hydroxide, hydrogen peroxide, and water may be present in concentrations defined by dilution ratios of between 5/1/1 to 1000 Jan. 1, respectively. In some embodiments, the ammonium hydroxide/hydrogen peroxide ratio may be varied between 0.05/1 and 5/1. In some embodiments, no hydrogen peroxide is used at all. The ammonium hydroxide in the second cleaning solution would be from a solution of 28-29% w/w of ammonia to water. The hydrogen peroxide in the second cleaning solution would be from a solution of 31-32% w/w of hydrogen peroxide to water. The pH of the second cleaning solution may be between about 9 and 12 or between about 10 and 11 due to the ammonium hydroxide and the hydrogen peroxide.

In some embodiments, the second cleaning solution may further include dissolved hydrogen gas. The dissolved hydrogen gas in the second cleaning solution may provide cavitation (bubble creation) to the second cleaning solution.

Providing cavitation to the second cleaning solution may enhance the post-etching cleaning process. In some embodiments, the concentration of the dissolved hydrogen gas may be between about 0.01 mg/L and about 5 mg/L or between about 0.1 mg/L and about 5 mg/L. In some embodiments, other suitable cavitation gases such as nitrogen, helium, Argon, or oxygen may also be used. For example, dissolved oxygen having concentration between about 1 mg/L and about 20 mg/L may be used in the second cleaning solution.

In some embodiments, the process time of the second stage of the post-etching cleaning process may be between about 30 seconds and about 100 seconds, between about 30 seconds and 90 seconds, or between about 30 seconds and about 60 seconds. In some embodiments, the temperature of the second cleaning solution may be between about 40° C. and about 85° C.

The second inter-stage rinse may be performed after the second stage of the post-etching cleaning process. The second inter-stage rinse may be performed with a procedure similar to the first inter-stage rinse, and descriptions thereof are not repeated herein.

In some embodiments, during the third stage of the post-etching cleaning process, the intermediate semiconductor device after the second inter-stage rinse may be spun at a rate between about 10 rpm and about 2000 rpm or between about 100 rpm and 1000 rpm. The third cleaning solution may be sprayed onto the intermediate semiconductor device to cover the entire front side of the intermediate semiconductor device. Simultaneously to applying the third cleaning solution onto the front side of the intermediate semiconductor device, water or other suitable solution may be applied to the backside of the intermediate semiconductor device to clean the backside of the intermediate semiconductor device.

In some embodiments, the third cleaning solution may be an acidic solution including, for example, aqueous solution of inorganic acids such as hydrochloric acid, hydrofluoric acid, sulfuric acid and nitric acid, and aqueous solution of organic acids such as oxalic acid, citric acid, malonic acid, malic acid, fumaric acid and maleic acid. In some embodiments, the third cleaning solution may also include hydrogen peroxide. The concentration of the acidic solution may be between about 0.001% and about 10% by weight or between about 0.01% and about 5% by weight. When the concentration is too low, the washing effect may not be obtained sufficiently. When the concentration is too high, metal-corrosion of the washing apparatus or the other related apparatus may occur.

A post-stage rinse may be performed after the third stage of the post-etching cleaning process. The post-stage rinse may be performed with a procedure similar to the first inter-stage rinse, and descriptions thereof are not repeated herein.

In some embodiments, the second stage and the third stage of the post-etching cleaning process may be optional. In other words, only the first stage of the post-etching cleaning process may be performed. In some embodiments, the third stage of the post-etching cleaning process may be optional. In other words, only the first stage and the second stage of the post-etching cleaning process may be performed.

Figure 6:

With reference to FIG. 6, the top hard mask layer 703 and the bottom hard mask layer 701 may be removed by, for example, an etching process such as a wet etching process or a dry etching process. In the present embodiment, the top hard mask layer 703 and the bottom hard mask layer 701 may be removed by wet etching process. In some embodiments, the etch rate ratio of the top hard mask layer 703 (or the bottom hard mask layer 701) to the substrate 101 may be between about 100:1 and about 1.05:1, between about 15:1 and about 2:1, or between about 10:1 and about 2:1 during the etching process.

With reference to FIG. 1 and FIGS. 7 to 12, at step S13, a plurality of first outer filling layers 301 may be formed in the plurality of first trenches TR1, a plurality of first center layers 303 may be formed on the plurality of first outer filling layers 301 and within the plurality of first trenches TR1, a second outer filing layer 401 may be formed in the second trench TR2, a second center layer 403 may be conformally formed on the second outer filing layer 401, and a second inner filling layer 405 may be formed on the second center layer 403 and within the second trench TR2.

Figure 7:

With reference to FIG. 7, a repairing layer 201 may be conformally formed on the substrate 101, on the plurality of first trenches TR1, and on the second trench TR2. In some embodiments, the repairing layer 201 may be formed of, for example, silicon. In some embodiments, the repairing layer 201 may be formed by, for example, atomic layer deposition, chemical vapor deposition, or other applicable deposition processes. In some embodiments, the repairing layer 201 may fill seams of the plurality of first trenches TR1 and the second trench TR2. In some embodiments, the repairing layer 201 may serve as a buffer or a stress-reducing layer. The repairing layer 201 may be used to mitigate the mechanical stresses caused by the difference in thermal expansion coefficients between the substrate 101 and the insulating material which will be filled in later.

Figure 8:

With reference to FIG. 8, a layer of first filling material 601 may be conformally formed on the repairing layer 201. The plurality of first trenches TR1 and the second trench TR2 may not be completely filled by the layer of first filling material 601. Detailedly, the layer of first filling material 601 may be conformally formed along the surface of the repairing layer 201 within the plurality of first trenches TR1 and the second trench TR2, resulting in upward-facing recesses RS1 (or first recess RS1) in the plurality of first trenches TR1 and an upward-facing recess RS2 (or second recess RS2) in second trench TR2. In some embodiments, the top surface of the layer of first filling material 601 may vary from region to region due to the loading effect of deposition. In some embodiments, the first filling material 601 may include silicon oxide or other applicable insulating materials.

In some embodiments, the layer of first filling material 601 may be formed of, for example, silicon oxide. In some embodiments, the layer of first filling material 601 may be formed by, for example, chemical vapor deposition, plasma-enhanced chemical vapor deposition, or other applicable deposition process.

In some embodiments, the layer of first filling material 601 may be formed by a thermal oxidation and a subsequent deposition process. For example, the layer of first filling material 601 may initially be formed by performing a rapid thermal oxidation to the intermediate semiconductor device illustrated in FIG. 7 in an oxide/oxynitride atmosphere to conformally form a thin layer (not shown for clarity) on the repairing layer 201. Subsequently, a flowable layer (not shown for clarity) may be conformally formed on the thin layer. Lastly, the flowable layer may be turned into the layer of first filling material 601.

In some embodiments, the flowable layer may include compounds having unsaturated bonding such as double bonds and triple bonds. The flowable layer may be characterized as a soft jelly-like layer, a gel having liquid flow characteristics, or a liquid layer but is not limited thereto. The flowable layer may flow into and fill small substrate gaps without forming voids or weak seams. A thermal process may be subsequently performed to transform the flowable layer into the layer of first filling material 601 by solidifying the flowable layer. The thermal process may break the unsaturated bonding into radicals, and the compounds may cross-link through the radicals. As a result, the flowable layer may be solidified. In some embodiments, the volume of the flowable layer may be reduced during the thermal process. Hence, the layer of first filling material 601 may have greater density compared to the flowable layer. The layer of first filling material 601 may be located at the position where the flowable layer previously occupied. In other words, the layer of first filling material 601 may be conformally disposed on the top surface 101T of the substrate 101, on the plurality of first trenches TR1, and on the second trench TR2.

Alternatively, in some embodiments, the flowable layer may be a flowable silicon-and-nitrogen-containing layer. The flowable silicon-and-nitrogen-containing layer may be formed by mixing a carbon-free silicon-containing precursor with a radical-nitrogen precursor. The flowable of nature the flowable silicon-and-nitrogen-containing layer may allow the flowable silicon-and-nitrogen-containing layer to flow into narrow substrate gaps or narrow trenches. The temperature of the substrate 101 during the formation of the flowable silicon-and-nitrogen-containing layer may be less than 120° C., less than 100° C., less than 80° C., or less than 60° C.

The carbon-free silicon-containing precursor may be, for example, a silicon-and-nitrogen precursor, a silicon-and-hydrogen precursor, or a silicon-nitrogen-and-hydrogen-containing precursor. In some embodiments, the carbon-free silicon-containing precursor may also be oxygen-free. The lack of oxygen results in a lower concentration of silanol (Si—OH) groups in the flowable silicon-and-nitrogen-containing layer formed from the carbon-free silicon-containing precursor. Excess silanol moieties in the flowable silicon-and-nitrogen-containing layer may cause increased porosity and shrinkage during subsequent processing that remove the hydroxyl (—OH) moieties from the flowable silicon-and-nitrogen-containing layer.

In some embodiments, the carbon-free silicon-containing precursor may include silyl-amines such as $H_2N(SiH_3)$, $HN(SiH_3)_2$, and $N(SiH_3)_3$. The flow rates of silyl-amines may be greater than or about 200 sccm, greater than or about 300 sccm, or greater than or about 500 sccm. These silyl-amines may be mixed with additional gases that may act as carrier gases, reactive gases, or both. Examples of these additional gases may include $H_2$, $N_2$, $NH_3$, He, and Ar.

In some embodiments, the carbon-free silicon-containing precursor may include silane either alone or mixed with other silicon (e.g., $N(SiH_3)_3$), hydrogen (e.g., $H_2$), and/or nitrogen (e.g., $N_2$, $NH_3$) containing gases.

In some embodiments, the carbon-free silicon-containing precursor may include disilane, trisilane, even higher-order silanes, and chlorinated silanes, alone or in combination with silyl-amines.

The radical-nitrogen precursor may be generated by delivering ammonia to a plasma region. The radical-nitrogen precursor may be subsequently delivered to mix with the carbon-free silicon-containing precursor. The flow rate of delivering ammonia to the plasma region may be greater than or about 300 sccm, greater than or about 500 sccm, or greater than or about 700 sccm. In some embodiments, gases such as nitrogen and hydrogen may be employed to adjust the nitrogen: hydrogen atomic flow ratio. In some embodiments, gases such as helium or argon may be employed as carrier gas for delivering ammonia to the plasma region.

In some embodiments, the radical-nitrogen precursor may be produced without using ammonia. Gases include one or more of hydrogen, nitrogen and hydrazine may be delivered to the plasma region to generate the radical-nitrogen precursor.

Subsequently, a cure process and an anneal process may be sequentially applied to the flowable silicon-and-nitrogen containing layer (i.e., the flowable layer) in an oxygen-containing atmosphere to convert the flowable silicon-and-nitrogen containing layer into the layer of first filling material 601 formed of silicon oxide. In some embodiments, the substrate temperature of the cure process may be below or about 400° C. For example, the substrate temperature of the cure process may be between about 100° C. and about 200° C. In some embodiments, the substrate temperature of the anneal process may be between about 500° C. and about 1100° C. In some embodiments, the oxygen-containing atmosphere may include one or more oxygen-containing gases such as molecular oxygen, ozone, water vapor, hydrogen peroxide, and nitrogen-oxides (e.g., nitric oxide, nitrous oxide, etc.).

Alternatively, in some embodiments, the flowable layer may be formed by reacting vapor phase precursors with co-reactants. The flowable layer may have flow characteristics that can provide consistent fill of substrate gaps of the substrate 101. Subsequently, a post-deposition treatment may be performed, and the flowable layer may be physically densified and/or chemically converted to reduce its flowability. After the post-deposition treatment, the flowable layer may be turned into the layer of first filling material 601. In some embodiments, the densified flowable layer may be considered to be solidified. In some embodiments, physically densifying the flowable layer may involve shrinking the flowable layer. In some embodiments, the post-deposition treatment may involve substituting chemicals in the flowable layer, which may result in a denser, higher volume layer of first filling material 601.

In some embodiments, the flowable layer may be flowable silicon oxide, silicon nitride, or silicon oxynitride. In some embodiments, the flowable layer may be silicon carbide or silicon oxycarbide. In some embodiments, chamber pressure for formation of the flowable layer may be between about 1 Torr and 200 Torr, between 10 and 75 Torr, or about 10 Torr. In some embodiments, substrate temperature for formation of the flowable layer may be between about −20° C. and about 100° C., between about −20° C. and 30° C., or between about −10° C. and about 10° C.

In some embodiments, the vapor phase precursors may include silicon containing precursors or carbon containing precursors. The co-reactants may include oxidants, catalyst, surfactants, or inert carrier gases.

The silicon containing precursors may include, but are not limited to, silane, disilane, trisilane, hexasilane, cyclohexasilane, alkoxysilanes, aminosilanes, alkylsilanes, tetraisocyanatesilane (TICS), hydrogen silsesquioxane, T8-hydridospherosiloxane, or 1,2-dimethoxy-1,1,2,2-tetramethyldisilane.

The alkoxysilanes may include tetraoxymethylcyclotetrasiloxane (TOMCTS), octamethylcyclotetrasiloxane (OMCTS), tetraethoxysilane (TEOS), triethoxysilane (TES), trimethoxysilane (TriMOS), methyltriethoxyorthosilicate (MTEOS), tetramethylorthosilicate (TMOS), methyltrimethoxysilane (MTMOS), dimethyldimethoxysilane (DMDMOS), diethoxysilane (DES), dimethoxysilane (DMOS), triphenylethoxysilane, 1-(triethoxysilyl)-2-(diethoxymethylsilyl) ethane, tri-t-butoxylsilanol, hexamethoxydisilane (HMODS), hexaethoxydisilane (HEODS), or tert-butoxydisilane. The aminosilanes may include bis-tert-butylamino silane (BTBAS) or tris(dimethylamino) silane.

The carbon containing precursors may include, but are not limited to, trimethylsilane (3 MS), tetramethylsilane (4 MS), diethoxymethylsilane (DEMS), dimethyldimethoxysilane, methyl-triethoxysilane (MTES), methyl-trimethoxysilane, methyl-diethoxysilane, methyl-dimethoxysilane, trimethoxymethylsilane, dimethoxymethylsilane, or bis(t-rimethylsilyl) carbodiimide.

The oxidants may include, but are not limited to, ozone, hydrogen peroxide, oxygen, water, alcohols, nitric oxide, nitrous dioxide, nitrous oxide, carbon monoxide, or carbon dioxide. The alcohols may include, for example, methanol, ethanol, or isopropanol.

The catalyst may include, but are not limited to, proton donor catalyst, halogen-containing compounds, mineral acids, bases, chloro-diethoxysilane, methanesulfonic acid, trifluoromethanesulfonic acid, chloro-dimethoxysilane, pyridine, acetyl chloride, chloroacetic acid, dichloroacetic acid, trichloroacetic acid, oxalic acid, benzoic acid, or triethylamine. The proton donor catalyst may include nitric acid, hydrofluoric acid, phosphoric acid, sulphuric acid, hydrochloric acid, bromic acid, carboxylic acid derivatives, ammonia, ammonium hydroxide, hydrazine, or hydroxylamine. The halogen-containing compounds may include dichlorosilane, trichlorosilane, methylchlorosilane, chlorotriethoxysilane, chlorotrimethoxysilane, chloromethyldiethoxysilane, chloromethyldimethoxysilane, vinyltrichlorosilane, diethoxydichlorosilane, or hexachlorodisiloxane. The mineral acids may include formic acid or acetic acid. The bases may include phosphine.

The surfactants may include solvents, alcohols, ethylene glycol, or polyethylene glycol. The surfactants may be used to relieve surface tension and increase wetting of reactants on the substrate surface. The surfactants may also increase the miscibility of the vapor phase precursors with the other reactants.

The solvents may be non-polar or polar and protic or aprotic. The solvents may be matched to the choice of vapor phase precursors to improve the miscibility in the oxidants. Non-polar solvents may include alkanes and alkenes; polar aprotic solvents may include acetones and acetates; and polar protic solvents may include alcohols and carboxylic compounds.

Examples of solvents include, but not limited to, methanol, ethanol, isopropanol, acetone, diethylether, acetonitrile, dimethylformamide, dimethyl sulfoxide, tetrahydrofuran, dichloromethane, hexane, benzene, toluene, isoheptane and diethylether. In some embodiments, the solvents may be introduced prior to the other reactants.

The inert carrier gases may include nitrogen, helium, or argon.

The post-deposition treatment may cross-link and remove terminal groups such as —OH and —H groups in the flowable layer, therefore increasing the density and hardness of the flowable layer. The post-deposition treatment may be thermal curing, exposure to a downstream or direct plasma, exposure to ultraviolet or microwave radiation, or exposure to another energy source.

While using thermal curing as the means of the post-deposition treatment, the temperature of thermal curing may be between about 200° C. and 600° C. The post-deposition treatment may be performed in an inert environment, an oxidizing environment, a nitridizing environment, or a mix of oxidizing and nitridizing environment. The inert environment may include argon or helium. The oxidizing environment may include oxygen, ozone, water, hydrogen peroxide, nitrous oxide, nitric oxide, nitrogen dioxide, carbon monoxide, carbon dioxide. The nitridizing environment may include nitrogen, ammonia, nitrous oxide, nitric oxide, nitrogen dioxide. The pressure of thermal curing may be between about 0.1 Torr and about 10 Torr.

While using the exposure to a downstream or direct plasma as the means of the post-deposition treatment, the plasma may be an inert plasma or a reactive plasma. The inert plasma may be helium and argon plasma. The reactive plasma may be oxidizing plasma including oxygen and steam, or hydrogen-containing plasma including hydrogen and a diluent such as inert gas. In some embodiments, the temperature during plasma exposure may be about 25° C. or higher. In some embodiments, the temperature during plasma exposure may be between about −15° C. and about 25° C.

With reference to FIG. 8, the width W1 of the first recess RS1 may be less than the width W2 of the second recess RS2. In some embodiments, the thickness T1 of the layer of first filling material 601 formed in the first trench TR1 may be greater than the thickness T2 of the layer of first filling material 601 formed in the first trench TR2.

Figure 9:

With reference to FIG. 9, a layer of second filling material 603 may be conformally formed on the layer of first filling material 601. Detailedly, the layer of second filling material 603 may completely fill the first recess RS1 and may not completely fill the second recess RS2. Detailedly, the layer of second filling material 603 may conformally formed along the surface (i.e., the second recess RS2) of the layer of first filling material 601 within the second trench TR2, resulting in upward-facing recesses RS3 (or third recess RS3) in the second trench TR2.

In some embodiments, the second filling material 603 may be formed of a material having etching selectivity to the first filling material 601. In some embodiments, the second filling material 603 may include silicon nitride or other applicable insulating material. In some embodiments, the layer of second filling material 603 may serve as a stop layer for the subsequent planarization process or etching process. In some embodiments, the layer of second filling material 603 may be formed of, for example, atomic layer deposition, chemical vapor deposition, or other applicable deposition process.

Figure 10:
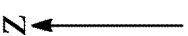

With reference to FIG. 10, a layer of third filling material 605 may be formed on the layer of second filling material 603. The layer of third filling material 605 may completely fill the third recess RS3. In some embodiments, a pit may be formed above the second trench TR2. In some embodiments, the third filling material 605 may be formed of a material having etching selectivity to the second filling material 603. In some embodiments, the third filling material 605 may include the same material as the first filling material 601. In some embodiments, the third filling material 605 may include silicon oxide or other applicable material. In some embodiments, the layer of third filling material 605 may be formed by, for example, chemical vapor deposition, plasma-enhanced chemical vapor deposition, or other applicable deposition processes.

In some embodiments, a high aspect ratio process may be performed to deposit the layer of third filling material 605, ensuring complete filling of the third recess RS3 and covering the layer of second filling material 603. The high aspect ratio process may involve two stages. During the first stage, a low deposition rate is employed to achieve a more uniform trench fill and reduce the likelihood of void formation. In the second stage, a rapid deposition rate is used to increase overall production efficiency by reducing the deposition time. This high aspect ratio process incorporates both slower and higher deposition rate stages, strategically utilizing the slower deposition rate when it is advantageous for reducing defects and the higher deposition rate for shorter deposition time. Additionally, in some embodiments, the pressure during the high aspect ratio process may range between about 200 Torr and about 760 Torr, while the temperature may be between about 400° C. and about 570° C.

In some embodiments, a two-stage anneal process may be performed after the high aspect ratio process. During the first stage of the two-stage anneal, a lower temperature environment containing one or more oxygen-containing species, such as water, oxygen, nitric oxide, or nitrous oxide, is used. This first stage aims to rearrange and strengthen the silicon oxide network, thereby preventing the formation of voids and the opening of weak seams in the third recess RS3. Additionally, the lower temperature in the first stage prevents oxygen from reacting with the trench walls and other parts of the substrate 101, which could lead to the formation of undesirable oxide layers.

Subsequently, in the second stage of the two-stage anneal, a higher temperature environment without oxygen is employed. The second stage serves to further rearrange the structure of the third filling material 605 and drive out moisture, both of which increase the density of the layer of third filling material 605. The environment during the second stage may be, for example, substantially pure nitrogen, a mixture of nitrogen and noble gases (e.g., helium, neon, argon, or xenon), or a substantially pure noble gas. It may also include reducing gases like hydrogen or ammonia. The second stage facilitates high-temperature densification without causing oxidation of the substrate 101.

Figure 11:

With reference to FIG. 11, after the two-stage anneal, a planarization process, such as chemical mechanical polishing, may be performed until the top surface 603T of the layer of second filling material 603 is exposed to remove excess material and provide a substantially flat surface for subsequent processing steps. The layer of second filling material 603 may serve as a stop layer in the planarization process. The top surface 603T of the layer of second filling material 603 and the top surface 605T of the layer of third filling material 605 may be substantially coplanar in the current stage.

Figure 12:
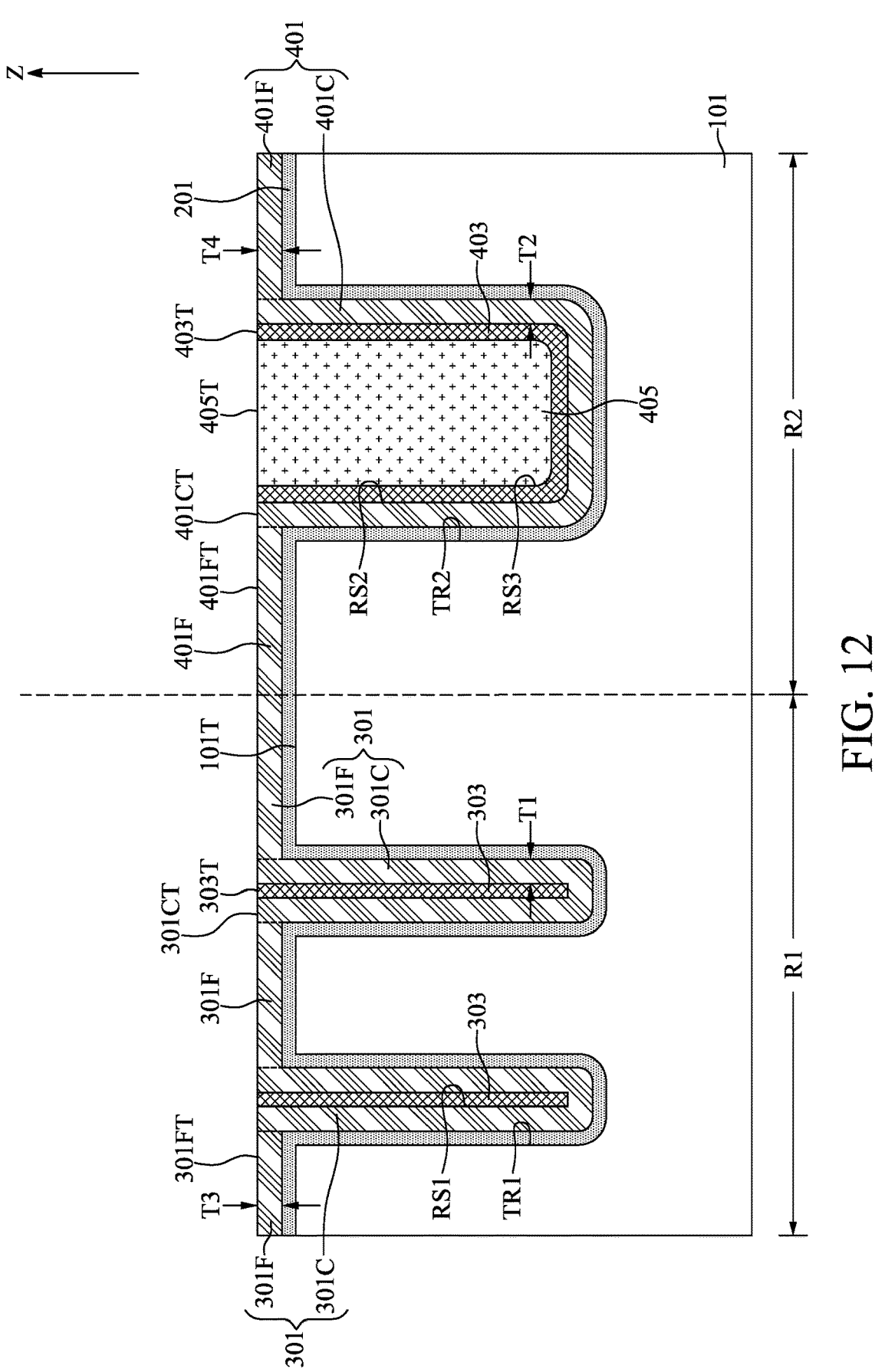

With reference to FIG. 12, an etching back process may be performed. After the majority of the layer of first filling material 601 is exposed and most of the second filling material 603 over the substrate 101 is removed. The etch rate of the third filling material 605 of the etching back process may be substantially the same as the etch rate of the second filling material 603 of the etching back process. In some embodiments, the etching back process may be a dry etching process. In some embodiments, a post-etching cleaning process may be performed after the etching back process. The post-etching cleaning process may be performed with a procedure similar to that illustrated in FIG. 5, and descriptions thereof are not repeated herein.

With reference to FIG. 12, the remaining first filling material 601 may be referred to as the first outer filling layer 301 and the second outer filing layer 401. The first outer filling layer 301 may be formed in the first region R1 and may include a plurality of first concave portions 301C and a first flat portion 301F. The plurality of first concave portions 301C may be formed on the repairing layer 201 and within the plurality of first trenches TR1, respectively and correspondingly. Each of the plurality of the first concave portions 301C may include a U-shaped cross-sectional profile, resulting in the upward-facing first recess RS1. The ends of the plurality of first concave portions 301C may protrude from the top surface 101T of the substrate 101. The first flat portion 301F may be formed on the repairing layer 201 and may be parallel to the top surface 101T of the substrate 101. The first flat portion 301F may connect the ends of the plurality of first concave portions 301C.

With reference to FIG. 12, the second outer filing layer 401 may be formed in the second region R2 and may include a second concave portion 401C and a second flat portion 401F. The second concave portion 401C may be formed on the repairing layer 201 and within the second trench TR2. The second concave portion 401C may include a U-shaped cross-sectional profile, resulting in the upward-facing second recess RS2. The ends of the second concave portion 401C may protrude from the top surface 101T of the substrate 101. The second flat portion 401F may be formed on the repairing layer 201 and may be parallel to the top surface 101T of the substrate 101. The second flat portion 401F may connect the ends of the second concave portion 401C. The first flat portion 301F and the second flat portion 401F may be connected and can be considered as a uniform flat layer formed on the repairing layer 201 and parallel to the top surface 101T of the substrate 101.

With reference to FIG. 12, the remaining second filling material 603 may be referred to as the plurality of first center layers 303 and the second center layer 403. For brevity, clarity, and convenience of description, only one first center layer 303 is described. The first center layer 303 may be formed on the first concave portion 301C and may completely fill the first recess RS1. In the current stage, the top surface 303T of the first center layer 303, the top surface 301CT of the first concave portion 301C, and the top surface 301 FT of the first flat portion 301F may be substantially coplanar.

With reference to FIG. 12, the second center layer 403 may be conformally formed on the second concave portion 401C and may include a U-shaped cross-sectional profile, resulting in the upward-facing third recess RS3. The ends of the second center layer 403 may protrude from the top surface 101T of the substrate 101. The second inner filling layer 405 may be formed on the second center layer 403 and completely fill the third recess RS3. In the current stage, the top surface 405T of the second inner filling layer 405, the top surface 403T of the second center layer 403, the top surface 401CT of the second concave portion 401C, and the top surface 401 FT of the second flat portion 401F may be substantially coplanar. In some embodiments, the top surface 401 FT of the second flat portion 401F and the top surface 301 FT of the first flat portion 301F may be substantially coplanar.

With reference to FIG. 12, in some embodiments, the thickness T1 of the first concave portion 301C and the thickness T3 of the first flat portion 301F may be substantially the same. In some embodiments, the thickness T1 of the first concave portion 301C and the thickness T3 of the first flat portion 301F may be different. In some embodiments, the thickness T2 of the second concave portion 401C and the thickness T4 of the second flat portion 401F may be substantially the same. In some embodiments, the thickness T2 of the second concave portion 401C and the thickness T4 of the second flat portion 401F may be different. In some embodiments, the thickness T2 of the first flat portion 301F and the thickness T4 of the second flat portion 401F may be substantially the same. In some embodiments, the thickness T1 of the first concave portion 301C may be greater than the thickness T2 of the second concave portion 401C.

Figure 13:
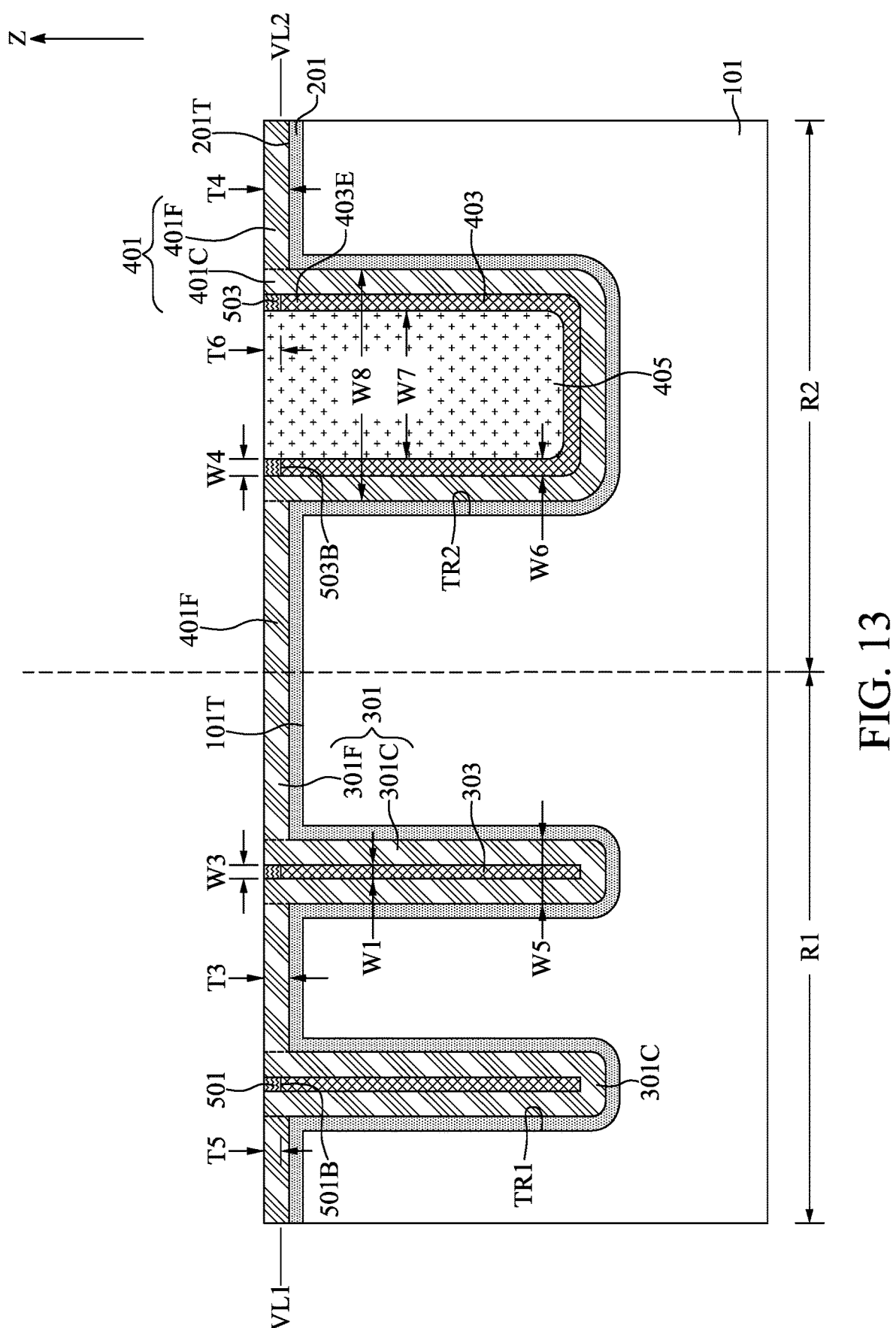

With reference to FIGS. 1 and 13, at step S15, a plurality of first protection layers 501 may be formed on the plurality of first center layers 303 and a second protection layer 503 may be formed on the second center layer 403.

With reference to FIG. 13, a surface oxidation process may be performed to oxidize the top ends of the plurality of first center layers 303 and the top ends of the second center layer 403, which are formed of silicon nitride in the present embodiment. The oxidized ends of the plurality of first center layers 303 and the oxidized end of the second center layer 403 may be referred to as the plurality of first protection layers 501 and the plurality of second protection layers 503, respectively. The plurality of first protection layers 501 may be disposed on the plurality of first center layers 303, respectively and correspondingly. The plurality of second protection layers 503 may be disposed on two ends 403E of the second center layer 403, respectively and correspondingly.

In some embodiments, the surface oxidation process may be a low-temperature plasma oxidation process. The low-temperature plasma oxidation process for converting silicon nitride into silicon oxide may involve several steps and specific process conditions. First, the intermediate semiconductor device illustrated in FIG. 12 may be loaded into a plasma-enhanced chemical vapor deposition (PECVD) chamber maintained at a low temperature between about 200° C. and about 400° C. Then, a gas mixture of oxygen and an inert gas, such as nitrogen or argon, may be introduced into the chamber with controlled flow rates. The flow rate of oxygen may be set in the range of about 10 standard cubic centimeter per minute (sccm) and about 100 sccm, while the inert gas flow rate can vary from about 50 sccm to about 500 sccm. Radio frequency (RF) power may be applied to generate a low-temperature plasma with a power level of about 50 watts and about 300 watts. The RF power excites the gas mixture, creating reactive species, including oxygen radicals, which play a crucial role in the low-temperature plasma oxidation process.

During the low-temperature plasma oxidation process, the oxygen radicals react with the silicon nitride surface, converting it into silicon oxide without the need for high temperatures. The low-temperature plasma oxidation process is self-limiting, meaning the reaction rate decreases as the silicon nitride layer is converted into silicon oxide. The oxidation time may be carefully controlled to achieve the desired thickness of the silicon oxide layer (i.e., the plurality of first protection layers 501 and the second protection layer 503), and it typically ranges from a few minutes to tens of minutes, depending on the required film thickness and properties. After the oxidation step, the plasma is deactivated, and a purge gas, usually nitrogen, is introduced into the chamber to remove any residual reactive species and by-products.

For brevity, clarity, and convenience of description, only one first protection layer 501 is described.

With reference to FIG. 13, the bottom surface 501B of the first protection layer 501 may be at a vertical level VL1 higher than the top surface 101T of the substrate 101 or the top surface 201T of the repairing layer 201. In some embodiments, the thickness T5 of the first protection layer 501 may be less than the thickness T3 of the first flat portion 301F. In some embodiments, the ratio of the thickness T5 of the first protection layer 501 to the thickness T3 of the first flat portion 301F may be between about 0.1 and about 0.8 or between about 0.3 and about 0.6. In some embodiments, the width W1 of the first center layer 303 and the width W3 of the first protection layer 501 may be substantially the same. In some embodiments, the ratio of the width W3 of the first protection layer 501 to the width W5 of the first concave portion 301C may be between about 0.05 and about 0.35 or between about 0.10 and about 0.30.

With reference to FIG. 13, the bottom surface 503B of the second protection layer 503 may be at a vertical level VL2 higher than the top surface 101T of the substrate 101 or the top surface 201T of the repairing layer 201. In some embodiments, the thickness T6 of the second protection layer 503 may be less than the thickness T4 of the second flat portion 401F. In some embodiments, the ratio of the thickness T6 of the second protection layer 503 to the thickness T4 of the second flat portion 401F may be between about 0.1 and about 0.8 or between about 0.3 and about 0.6. In some embodiments, the width W4 of the second protection layer 503 and the width W6 of the second center layer 403 may be substantially the same. In some embodiments, the ratio of the width W7 of the second inner filling layer 405 to the width W8 of the second concave portion 401C may be between about 0.60 and about 0.95 or between about 0.70 and about 0.90.

With reference to FIG. 13, in some embodiments, the bottom surface 501B of the first protection layer 501 and the bottom surface 503B of the second protection layer 503 may be substantially coplanar. In some embodiments, the bottom surface 501B of the first protection layer 501 and the bottom surface 503B of the second protection layer 503 may be at different vertical levels.

With reference to FIG. 1 and FIGS. 14 to 17, at step S17, an implantation process IMP may be performed over the substrate 101 and a word line hard mask layer 203 may be formed over the substrate 101.

Figure 14:
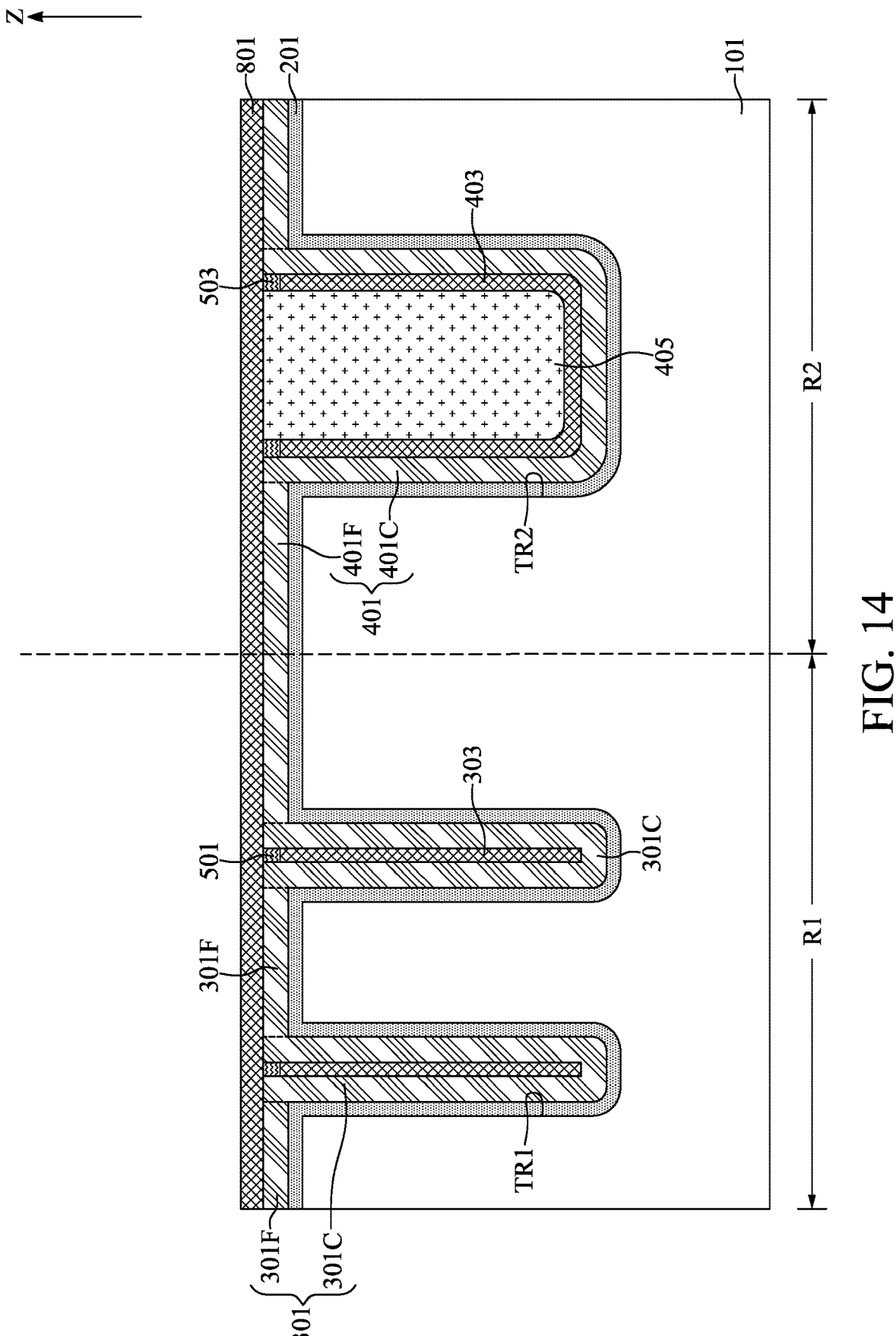

With reference to FIG. 14, a sacrificial mask layer 801 may be formed over the substrate 101 to cover the first outer filling layer 301, the first protection layer 501, the second outer filing layer 401, and the second protection layer 503. In some embodiments, the sacrificial mask layer 801 may be formed of a material having high etching selectivity to the first outer filling layer 301 and the second outer filing layer 401. In some embodiments, the sacrificial mask layer 801 may be formed of a material different from the first outer filling layer 301 and the second outer filing layer 401. In some embodiments, the sacrificial mask layer 801 may be formed of silicon nitride. In some embodiments, the sacrificial mask layer 801 may be formed with a procedure similar to the layer of second filling material 603 that illustrated in FIG. 9, and descriptions thereof are not repeated herein.

The sacrificial mask layer 801 plays a crucial role in safeguarding the first outer filling layer 301 and the second outer filling layer 401 during subsequent implantation processes. Acting as a protective shield, the sacrificial mask layer 801 prevents potential damage to the top surfaces of the aforementioned layers, which could otherwise occur during the implantation process or post-implantation cleaning procedures. The presence of the sacrificial mask layer 801 is vital as it ensures the integrity of the contact area of the semiconductor device 1. Without this protective layer, the active area of the semiconductor device 1 may experience reduced contact area, leading to potential reliability issues and diminished performance. Therefore, the sacrificial mask layer 801 significantly contributes to the overall reliability and functionality of the semiconductor device 1.

Figure 15:
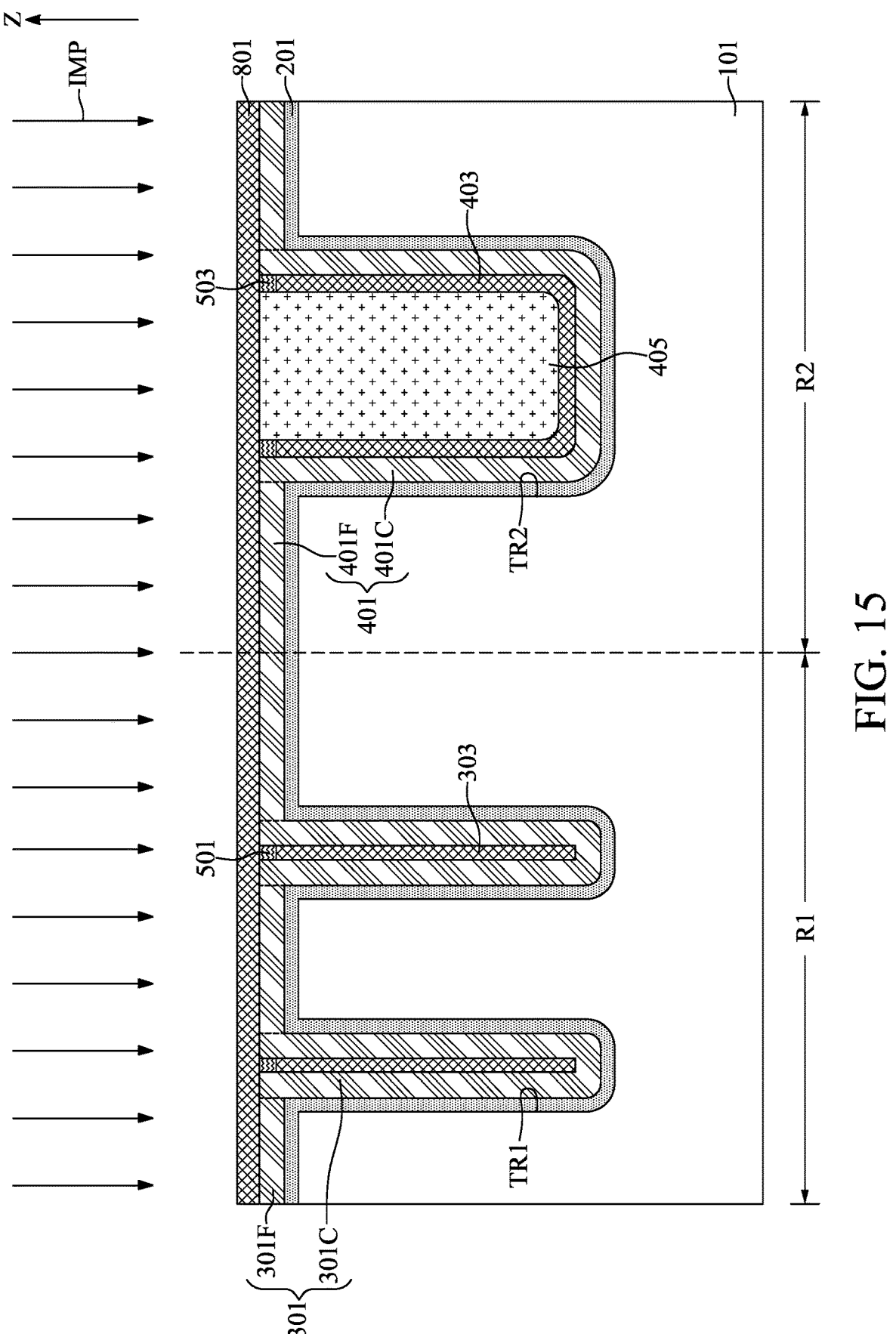

With reference to FIG. 15, the implantation process IMP may be performed using p-type dopants or n-types dopants so as to form the active areas (not shown for clarity) of the semiconductor device 1 in the substrate 101. The p-type dopants may be added to an intrinsic semiconductor to create deficiencies of valence electrons. In a silicon-containing substrate, examples of p-type dopants include but are not limited to boron, aluminum, gallium, and indium. The n-type dopants may be added to an intrinsic semiconductor to contribute free electrons to the intrinsic semiconductor. In a silicon-containing substrate, examples of n-type dopants include but are not limited to antimony, arsenic, and phosphorus.

After the implantation process IMP, a post-implantation cleaning process may be performed. The post-implantation cleaning process may be a critical step to ensure the integrity and reliability of the semiconductor device 1. After the implantation process IMP, the intermediate semiconductor device may be first rinsed with deionized water to remove loose particles and debris. Subsequently, a pre-cleaning step may be carried out using a diluted acid solution, typically a mixture of sulfuric acid and hydrogen peroxide in a 3:1 ratio, to eliminate metallic contaminants and/or surface oxide layers. The intermediate semiconductor device then may undergo multiple rinses with deionized water to thoroughly remove any residual cleaning solution and contaminants. The RCA clean step follows, employing an RCA-2 solution composed of deionized water, hydrogen peroxide, and ammonium hydroxide in a 5:1:1 ratio, heated to about 70° C. to about 80° C. This step effectively removes metal ion contaminants, organic residues, and ensures a cleaner surface. The intermediate semiconductor device may be subsequently subjected to additional rinses to eliminate any remaining cleaning chemicals or particles. Finally, the intermediate semiconductor device may be dried using a spin-dryer or nitrogen gas flow to prevent watermarks or contamination.

Figure 16:
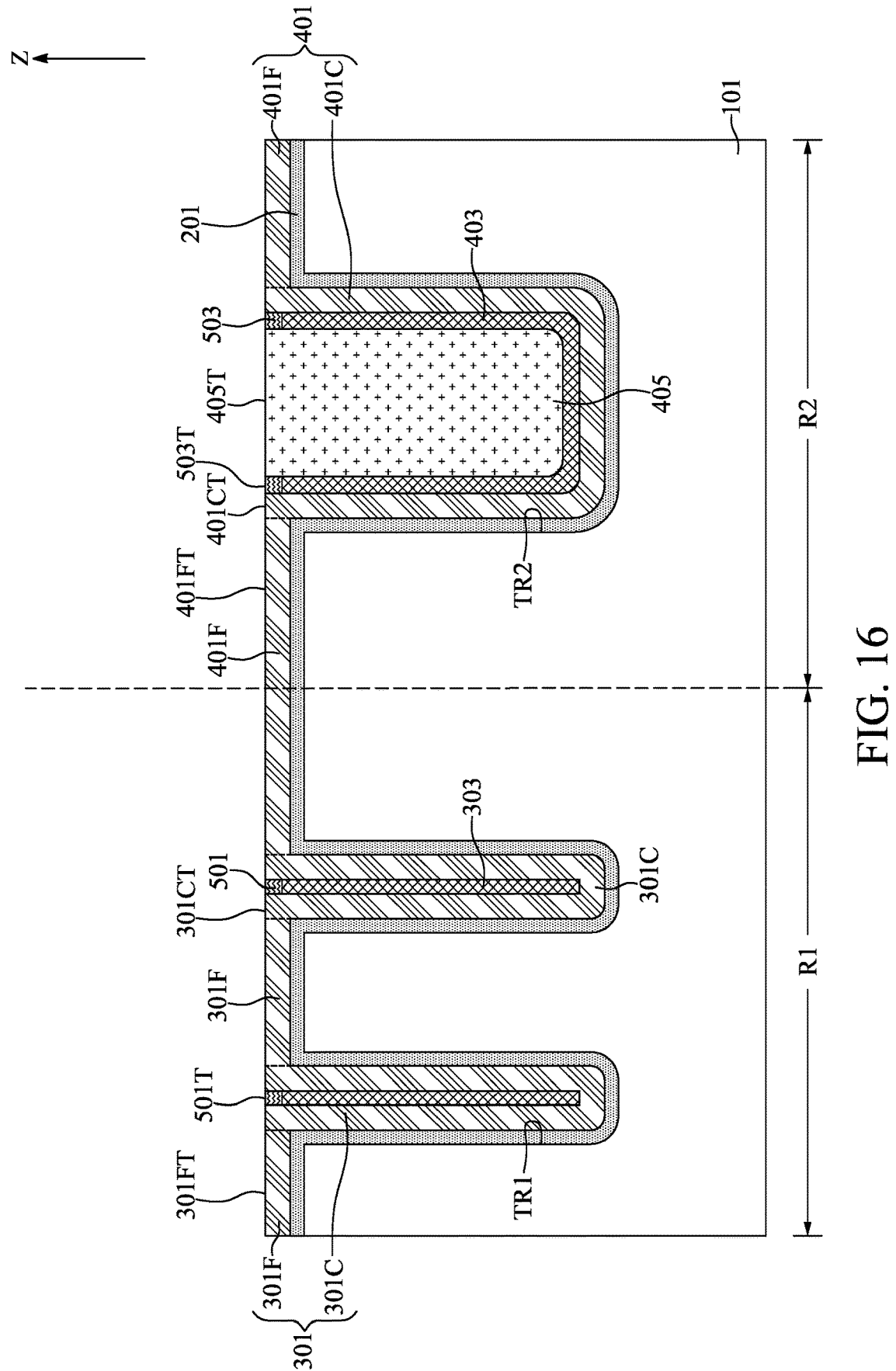

With reference to FIG. 16, the sacrificial mask layer 801 is selectively removed. This removal is achieved through an etching process with high etching selectivity to the sacrificial mask layer 801. During the etching process, the etch rate for the sacrificial mask layer 801, which may be formed of silicon nitride in some embodiments, is greater than the etch rate for the first outer filling layer 301, the second outer filling layer 401, the first protection layer 501, and the second protection layer 503, which may be formed of silicon oxide in some embodiments. For example, the etching process selectively removes silicon nitride while leaving silicon oxide intact.

The first protection layer 501 and the second protection layer 503 serve to prevent the underlying first center layer 303 and second center layer 403 from being removed during the etching process. Therefore, after the removal of the sacrificial mask layer 801, the top surfaces, namely, the top surface 301 FT of the first flat portion 301F, the top surface 301CT of the first concave portion 301C, the top surface 501T of the first protection layer 501, the top surface 401 FT of the second flat portion 401F, the top surface 401CT of the second concave portion 401C, the top surface 405T of the second inner filling layer 405, and the top surface 503T of the second protection layer 503, are substantially coplanar. That is, the surface of the semiconductor device 1 may be intact and substantially flat for subsequent semiconductor processes. As a result, the reliability of the semiconductor device 1 may be improved.

In some comparative embodiments, if the first protection layer 501 and the second protection layer 503 are not present, the first center layer 303 and the second center layer 403, which may be formed of silicon nitride, may also be removed during the removal of the sacrificial mask layer 801, resulting in small recesses. As a consequence, the reliability of the semiconductor device 1 may be affected.

Figure 17:
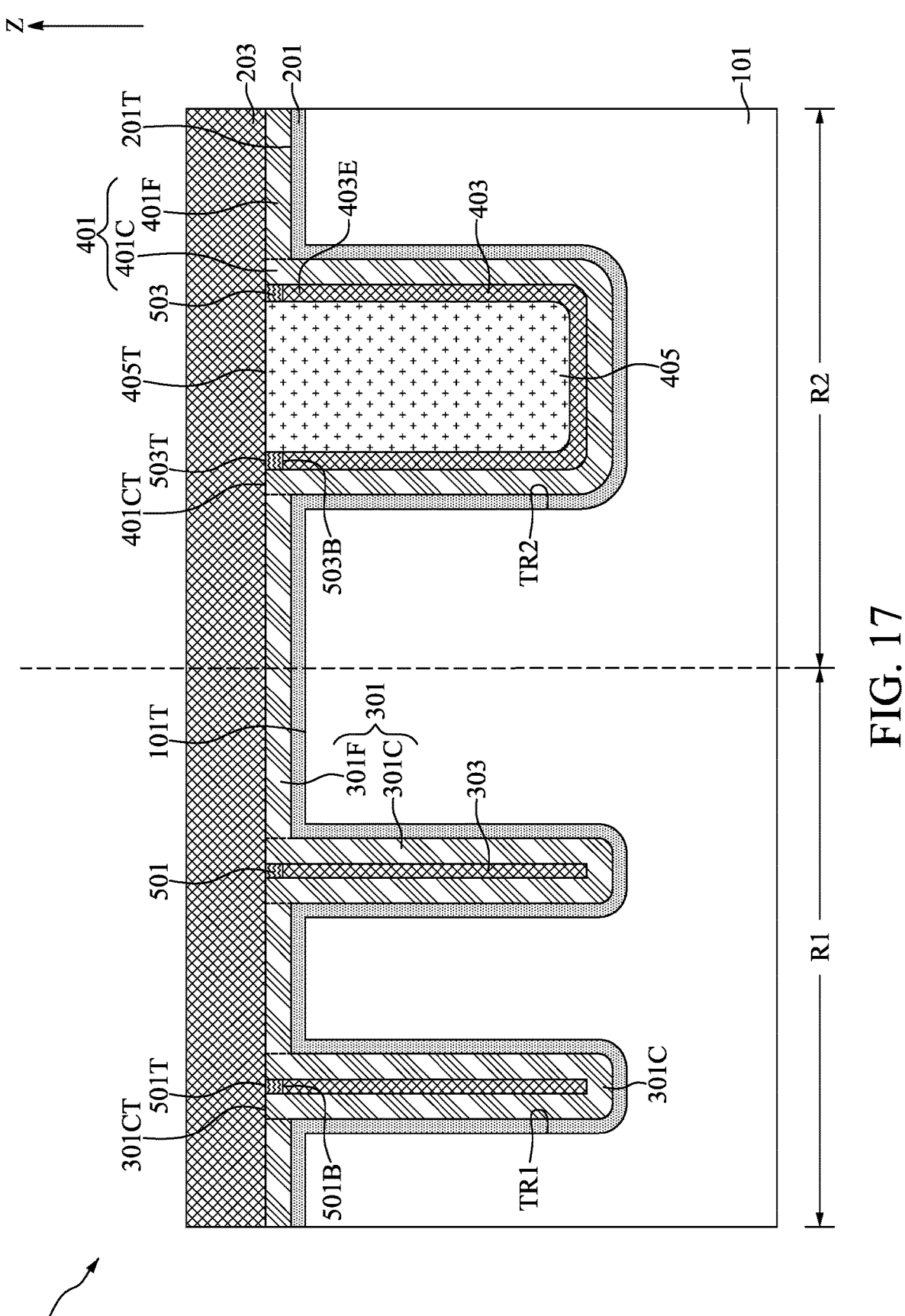

With reference to FIG. 17, a word line hard mask layer 203 may be formed on the first outer filling layer 301, on the second outer filing layer 401, on the first protection layer 501, and on the second protection layer 503. In some embodiments, the word line hard mask layer 203 may be formed of the same material as the first center layer 303 or the second center layer 403. In some embodiments, the word line hard mask layer 203 may be formed of, for example, silicon nitride. In some embodiments, the word line hard mask layer 203 may be formed by, for example, chemical vapor deposition, plasma-enhanced chemical vapor deposition, or other applicable deposition processes.

One aspect of the present disclosure provides a semiconductor device including a substrate; a first outer filling layer including a first concave portion inwardly positioned in the substrate and including a U-shaped cross-sectional profile, and a first flat portion positioned on the substrate and connecting to the first concave portion; a first center layer positioned on the first concave portion of the first outer filling layer; and a first protection layer positioned on the first center layer. A top surface of the first concave portion and a top surface of the first protection layer are substantially coplanar.

Another aspect of the present disclosure provides a semiconductor device including a substrate including a first region and a second region; a second outer filing layer including a second concave portion inwardly positioned in the second region of the substrate and including a U-shaped cross-sectional profile, and a second flat portion positioned on the substrate and connecting to the second concave portion; a second center layer conformally positioned on the second concave portion and including a U-shaped cross-sectional profile; an inner filling layer positioned on the second center layer; and a plurality of second protection layers positioned on two ends of the second center layer and positioned between the second concave portion and the inner filling layer. A top surface of the second concave portion, a top surface of the inner filling layer, and a top surface of the plurality of second protection layers are substantially coplanar.

Another aspect of the present disclosure provides a method for fabricating a semiconductor device including providing a substrate; forming a first trench in the substrate; conformally forming a layer of first filling material on the substrate and within the first trench, resulting in forming a first recess within the first trench; forming a layer of second filling material on the layer of first filling material, completely filling the first recess; performing a planarization process until the layer of first filling material is exposed to turn the layer of first filling material into a first outer filling layer and turn the layer of second filling material into a first center layer; and performing a surface oxidation process to form a first protection layer on the first center layer.

Due to the design of the semiconductor device in the present disclosure, the surface (i.e., the top surfaces of the first outer filling layer 301, the second outer filling layer 401, the first protection layer 501, and the second protection layer 503) remains intact and substantially flat for subsequent semiconductor processes. As a result, the reliability of the semiconductor device 1 is improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a first outer filling layer comprising:
a first concave portion inwardly positioned in the substrate and comprising a U-shaped cross-sectional profile; and
a first flat portion positioned on the substrate and connecting to the first concave portion;
a first center layer positioned on the first concave portion of the first outer filling layer;
a first protection layer positioned on the first center layer; and
a repairing layer conformally positioned between the first outer filling layer and the substrate;
wherein a top surface of the first concave portion and a top surface of the first protection layer are substantially coplanar;
wherein the first center layer and the first protection layer comprise different materials;
wherein a bottom surface of the first protection layer is at a vertical level higher than a top surface of the substrate.

2. The semiconductor device of claim 1, wherein a ratio of a thickness of the first protection layer to a thickness of the first flat portion of the first outer filling layer is between about 0.1 and about 0.8.

3. The semiconductor device of claim 1, wherein a width of the first protection layer and a width of the first center layer are substantially the same.

4. The semiconductor device of claim 1, wherein a ratio of a width of the first protection layer to a width of the first concave portion of the first outer filling layer is between about 0.05 and about 0.35.

5. The semiconductor device of claim 1, wherein a bottom surface of the first protection layer is at a vertical level higher than a top surface of the repairing layer.

6. The semiconductor device of claim 1, wherein a thickness of the first concave portion and a thickness of the first flat portion are substantially the same.

7. A semiconductor device, comprising:
a substrate comprising a first region and a second region;
a second outer filing layer comprising:
a second concave portion inwardly positioned in the second region of the substrate and comprising a U-shaped cross-sectional profile; and
a second flat portion positioned on the substrate and connecting to the second concave portion;

a second center layer conformally positioned on the second concave portion and comprising a U-shaped cross-sectional profile;
an inner filling layer positioned on the second center layer; and
a plurality of second protection layers positioned on two ends of the second center layer and positioned between the second concave portion and the inner filling layer;
wherein a top surface of the second concave portion, a top surface of the inner filling layer, and a top surface of the plurality of second protection layers are substantially coplanar.

8. The semiconductor device of claim 7, further comprising a first outer filling layer, a plurality of first center layers, and a plurality of first protection layers;
wherein the first outer filling layer comprises:
a plurality of first concave portions inwardly positioned in the first region of the substrate, separated from each other, and comprising U-shaped cross-sectional profiles; and
a first flat portion positioned on the substrate and connecting the plurality of first concave portions;
wherein the plurality of first center layers respectively and correspondingly positioned on the plurality of first concave portions;
wherein the plurality of first protection layers respectively and correspondingly positioned on the plurality of first center layers;
wherein a top surface of the plurality of first concave portions and a top surface of the plurality of first protection layers are substantially coplanar.

9. The semiconductor device of claim 8, wherein the top surface of the plurality of first concave portions, the top surface of the plurality of first protection layers, the top surface of the second concave portion, the top surface of the inner filling layer, and the top surface of the plurality of second protection layers are substantially coplanar.

10. The semiconductor device of claim 9, further comprising a repairing layer conformally positioned between the substrate and the first outer filling layer and between the substrate and the second outer filing layer.

11. The semiconductor device of claim 10, further comprising a word line hard mask layer positioned on the first outer filling layer, on the second outer filing layer, on the plurality of first protection layers, and on the plurality of second protection layers.

12. The semiconductor device of claim 11, wherein the plurality of first center layers and the plurality of first protection layers comprise different materials.

13. The semiconductor device of claim 12, wherein the plurality of second protection layers and the second center layer comprise different materials.

14. The semiconductor device of claim 13, wherein a bottom surface of the plurality of first protection layers and a bottom surface of the plurality of second protection layers are at the same vertical level.

15. The semiconductor device of claim 14, wherein a thickness of the plurality of first concave portions and a thickness of the second concave portion are different.

16. The semiconductor device of claim 14, wherein a bottom surface of the plurality of second protection layers is at a vertical level higher than a top surface of the substrate.

17. The semiconductor device of claim 14, wherein a ratio of a thickness of the plurality of second protection layers to a thickness of the second flat portion is between about 0.1 and about 0.8.

* * * * *